(12) United States Patent
Huang

(10) Patent No.: US 7,679,432 B2
(45) Date of Patent: Mar. 16, 2010

(54) OPERATION AMPLIFIER AND CIRCUIT FOR PROVIDING DYNAMIC CURRENT THEREOF

(75) Inventor: Ju-Lin Huang, Taipei County (TW)

(73) Assignee: Novatek Microelectronics Corp., Hsinchu (TW)

( * ) Notice: Subject to any disclaimer, the term of this patent is extended or adjusted under 35 U.S.C. 154(b) by 83 days.

(21) Appl. No.: 11/831,975

(22) Filed: Aug. 1, 2007

(65) Prior Publication Data

US 2008/0272839 A1 Nov. 6, 2008

(30) Foreign Application Priority Data

May 4, 2007 (TW) .............................. 96115833 A

(51) Int. Cl.
*H03F 3/45* (2006.01)
(52) U.S. Cl. .................. 327/562; 327/561; 330/253; 330/255; 330/260
(58) Field of Classification Search ......... 327/560–563; 330/255, 259–261, 253
See application file for complete search history.

(56) References Cited

U.S. PATENT DOCUMENTS

| | | | |
|---|---|---|---|
| 6,100,762 A * | 8/2000 | Kato | 330/255 |
| 6,392,485 B1 * | 5/2002 | Doi et al. | 330/253 |
| 6,987,420 B2 * | 1/2006 | Miura | 330/255 |
| 7,049,890 B2 * | 5/2006 | Miura | 330/255 |
| 7,102,436 B2 * | 9/2006 | Sung | 330/255 |
| 7,154,332 B2 * | 12/2006 | Tsuchi | 330/255 |
| 7,173,490 B2 * | 2/2007 | Sung | 330/255 |
| 7,342,449 B2 * | 3/2008 | Ishii et al. | 330/253 |
| 2008/0157825 A1 * | 7/2008 | Hsu et al. | 327/108 |

OTHER PUBLICATIONS

Horowitz, Paul et al., "The Art of Electronics 2nd Edition", Cambridge University Press, 1989, p. 114-117.*

* cited by examiner

*Primary Examiner*—Lincoln Donovan
*Assistant Examiner*—Patrick O'Neill
(74) *Attorney, Agent, or Firm*—Jianq Chyun IP Office

(57) ABSTRACT

An operation amplifier (op-amp) and a circuit for providing dynamic current thereof are disclosed. The circuit can be applied to any current op-amp. The circuit comprises two transistors which are simultaneously or non-simultaneously turned on as the input signals respectively received by the first input and the second input of the op-amp get a transition, namely, as the op-amp is in the transient state, so as to increase the bias current at the first input terminal or/and the second input terminal of the op-amp by a dynamic current. Therefore, not only the internal slew rate of the op-amp can be accelerated by the circuit of the present invention, but also the power consumption of the op-amp can not be increased by the circuit of the present invention as the op-amp in the steady state.

8 Claims, 4 Drawing Sheets

OPERATION AMPLIFIER AND CIRCUIT FOR PROVIDING DYNAMIC CURRENT THEREOF

CROSS-REFERENCE TO RELATED APPLICATION

This application claims the priority benefit of Taiwan application serial no. 96115833, filed May 4, 2007. All disclosure of the Taiwan application is incorporated herein by reference.

BACKGROUND OF THE INVENTION

1. Field of the Invention

The present invention generally relates to an operation amplifier, and more particularly, to a circuit for providing dynamic current capable of advancing internal slew rate of an operation amplifier.

2. Description of Related Art

Most of analog circuits usually adopts voltage mode to process signals, wherein an operation amplifier (op-amp) in voltage mode is popular and favored by electrical circuit designers due to the low price and stability of electrical behavior. However, a conventional op-amp in voltage mode is limited by the constant gain bandwidth product (GBP) thereof and an insufficient transient response speed, which are limited an electrical circuit designer to deal with a high frequency signal case. In order to get rid of the above-mentioned limitation as dealing with a high frequency signal case, the electrical circuit designer would increase internal slew rate of an operation amplifier for the improving.

It is well known that the internal slew rate of an op-amp depends on the ratio $I_B/C_M$ of bias current $I_B$ of an op-amp over the internal compensation capacitance $C_M$ thereof. Thus, in order to advance internal slew rate of a conventional op-amp under the condition of a fixed internal compensation capacitance, the bias current of the op-amp input stage needs to be increased, however, it would make the pole/zero point and the GBP position drifted and accordingly deteriorate the stability of the op-amp. In addition, by increasing the bias current of the op-amp input stage to break through the limitation in case of dealing with a high frequency signal, the power consumption of the op-amp would accordingly increased as the op-amp is in the steady state.

SUMMARY OF THE INVENTION

Accordingly, the present invention is directed to provide a circuit for providing dynamic current, which employs two transistors to increase the bias currents of the first input terminal or/and the second input terminal of an op-amp by a dynamic current when the input signals respectively received by the first input terminal and the second input terminal of the op-amp get a transition, so that to advance the internal slew rate of the op-amp.

The present invention is also directed to provide an op-amp, which employs a circuit for providing dynamic current of the present invention to accelerate transient response of the op-amp to suit processing a higher frequency signal. In particular, the bias currents of the first input terminal or/and the second input terminal of the op-amp are respectively/simultaneously increased by a dynamic current only when the input signals respectively received by the first input terminal and the second input terminal of the op-amp get a transition (that is, the op-amp in transient state), thus, the power consumption of the op-amp is not increased as the op-amp is in steady state.

The present invention provides a circuit for providing dynamic current suitable for an op-amp, wherein two input signals respectively received by a first input terminal and a second input terminal of the op-amp and an output signal outputted by an output terminal of the op-amp, wherein the input signals and the output signal have a first common-mode level and a second common-mode level respectively. The circuit includes a first transistor and a second transistor, wherein the gate of the first transistor is used for receiving the output signal from the output terminal of the op-amp, the source of the first transistor is used for receiving the above-mentioned first common-mode level, and the drain of the first transistor is used for receiving a first dynamic current. The gate of the second transistor is used for receiving the output signal from the output terminal of the op-amp, the source of the second transistor is used for receiving the above-mentioned second common-mode level, and the drain of the second transistor is used for receiving a second dynamic current.

In an embodiment of the present invention, when the input signals respectively received by the first input terminal and the second input terminal of the op-amp get a first transition, the first transistor is turned on and the second transistor is turned off, so as to increase the bias current at the first input terminal of the op-amp by the above-mentioned first dynamic current, and when the input signals respectively received by the first input terminal and the second input terminal of the op-amp get a second transition, the first transistor is turned off and the second transistor is turned on, so as to increase the bias current at the second input terminal of the op-amp by the above-mentioned second dynamic current.

The present invention also provides a circuit for providing dynamic current suitable for an op-amp, two input signals respectively received by the first input terminal and the second input terminal of the op-amp and an output signal outputted by an output terminal of the op-amp, wherein the input signals and the output signal have a first common-mode level and a second common-mode level respectively. The circuit includes a first transistor and a second transistor, wherein the gate of the first transistor is used for receiving the above-mentioned second common-mode level, the source of the first transistor is used for receiving the above-mentioned first common-mode level, and the drain of the first transistor is used for receiving a first dynamic current. The gate of the second transistor is used for receiving the above-mentioned first common-mode level, the source of the second transistor is used for receiving the above-mentioned second common-mode level, and the drain of the second transistor is used for receiving a second dynamic current.

In an embodiment of the present invention, when the input signals respectively received by the first input terminal and the second input terminal of the op-amp get a first transition and a second transition, the first transistor and the second transistor are turned on, so as to increase the bias currents at the first input terminal and the second input terminal of the op-amp respectively by a first dynamic current and a second dynamic current.

The present invention also provides an op-amp implemented by employing one of the above-mentioned two circuits for providing dynamic currents of the present invention.

In an embodiment of the above-mentioned invention, the above-mentioned first transition has the transition from the low level to the high level, and the above-mentioned second transition has the transition from the high level to the low level.

In an embodiment of the above-mentioned invention, the above-mentioned first dynamic current and second dynamic current are provided respectively by a first current source and a second current source, and the first current source and the second current source have constant current source characteristic or variable current source characteristic.

In an embodiment of the above-mentioned invention, the above-mentioned first transistor is a PMOS-type transistor, and the above-mentioned second transistor is an NMOS-type transistor.

The circuit for providing dynamic current of the present invention is suitable for an op-amp today, which uses two transistors to be simultaneously or non-simultaneously turned on when the input signals respectively received by the first input terminal and the second input terminal of the op-amp get a transition (i.e. the op-amp is in transient state), so as to increase the bias currents of the first input terminal or/and the second input terminal of an op-amp by a dynamic current. In this way, the circuit for providing dynamic current of the present invention not only can advance the internal slew rate of the op-amp, but also can keep the power consumption of the op-amp not increased as the op-amp is in steady state.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
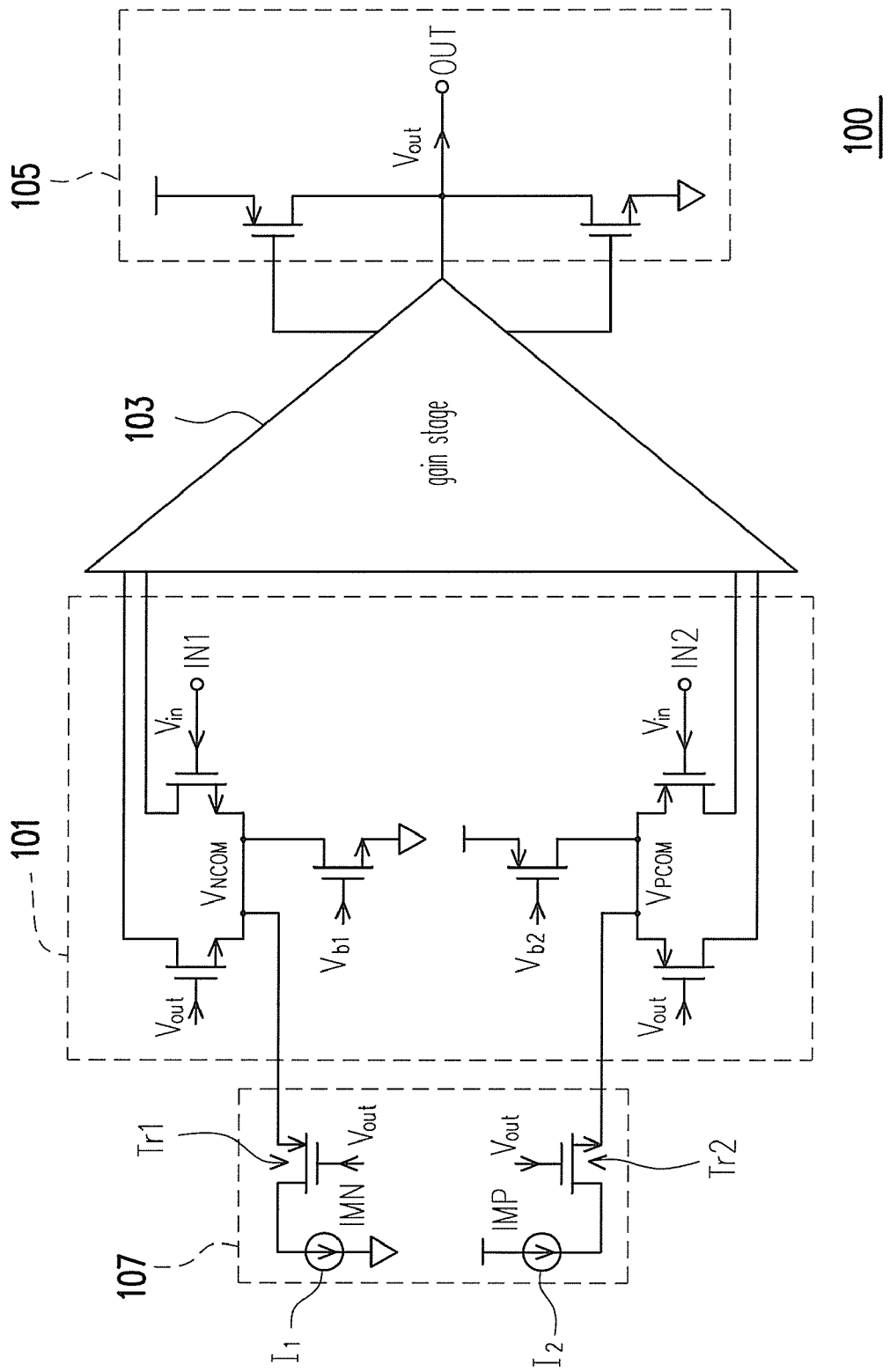
FIG. 1 is a circuit diagram of an operation amplifier according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The objective of the present invention is to advance internal slew rate of an op-amp and accelerate transient response of the op-amp so as to adapt processing a higher frequency signal and keep the power consumption thereof not increased as the op-amp is in steady state. The following depictions are intended to provide anyone skilled in the art with a detail reference regarding the technique features and the expected efficiency.

FIG. 1 is a circuit diagram of an operation amplifier according to an embodiment of the present invention. Referring to FIG. 1, an op-amp 100 includes an input stage 101, a gain stage 103, an output stage 105 and a circuit for providing dynamic current 107, wherein the input stage 101, the gain stage 103 and the output stage 105 are able to be implemented by using a conventional op-amp, and the circuit architectures and the operations thereof should be well known by anyone skilled in the art, which are omitted to describe herein to avoid a possible confusion with the spirit of the present invention.

Note that although the present embodiment has given a feasible circuit architecture of the input stage 101, the gain stage 103 and the output stage 105, the present invention is not limited by the given circuit architecture since the manufactures provide different designs of the input stage 101, the gain stage 103 and the output stage 105. In other words, a circuit designer should decide an appropriate architecture of the input stage, the gain stage and the output stage to meet the practical requirement.

Generally, the input signals $V_{in}$ respectively received by the first input terminal IN1 and the second input terminal IN2 of the op-amp 100 and the output signal $V_{out}$ outputted by the output terminal OUT of the op-amp 100, wherein the input signals $V_{in}$ and the output signal $V_{out}$ have a first common-mode level $V_{NCOM}$ and a second common-mode level $V_{PCOM}$. The op-amp 100 of the embodiment employs a circuit for providing dynamic current 107 to advance the internal slew rate of the op-amp 100, so as to enable an analog circuit designer to get rid of a limitation for processing a high frequency signal.

The circuit for providing dynamic current 107 includes a first transistor Tr1 and a second transistor Tr2, wherein the gate of the first transistor Tr1 is used for receiving the output signal $V_{out}$ from the output terminal OUT of the op-amp 100, the source of the first transistor Tr1 is used for receiving the first common-mode level $V_{NCOM}$, and the drain of the first transistor Tr1 is used for receiving a first dynamic current IMN. The gate of the second transistor Tr2 is used for receiving the output signal $V_{out}$ from the output terminal OUT of the op-amp 100, the source of the second transistor Tr2 is used for receiving the second common-mode level $V_{PCOM}$, and the drain of the second transistor Tr2 is used for receiving a second dynamic current IMP. In the present embodiment, the first transistor Tr1 is implemented by a PMOS-type transistor, and the second transistor Tr2 is implemented by an NMOS-type transistor. receiving the output signal $V_{out}$ from the output terminal OUT of the op-amp 100, the drain of the first transistor Tr1 is used for receiving the first common-mode level $V_{NCOM}$, and the source of the first transistor Tr1 is used for receiving a first dynamic current IMN. The gate of the second transistor Tr2 is used for receiving the output signal $V_{out}$ from the output terminal OUT of the op-amp 100, the drain of the second transistor Tr2 is used for receiving the second common-mode level $V_{PCOM}$, and the source of the second transistor Tr2 is used for receiving a second dynamic current IMP. In the present embodiment, the first transistor Tr1 is implemented by a PMOS-type transistor, and the second transistor Tr2 is implemented by an NMOS-type transistor.

Figure 2:
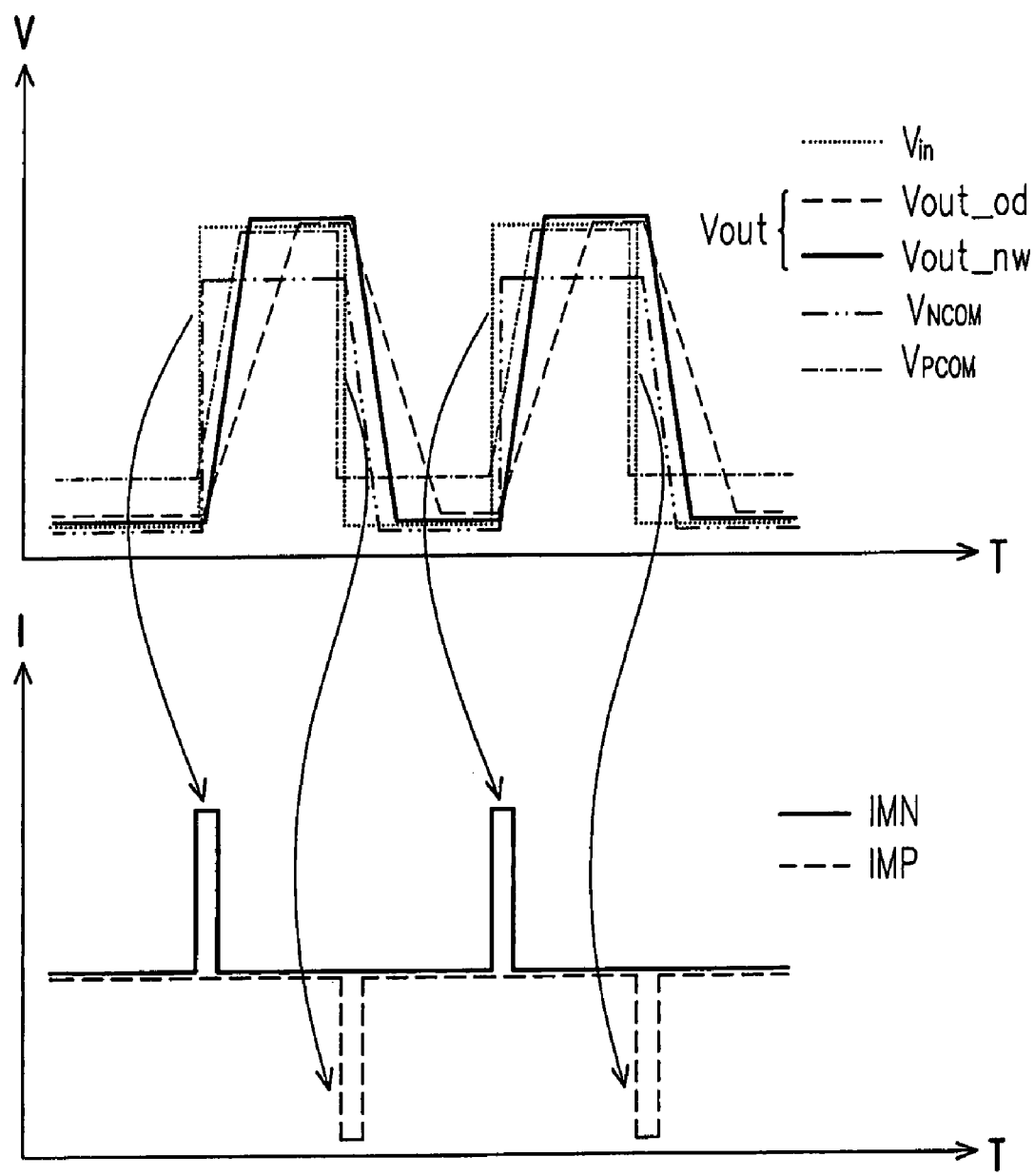
FIG. 2 is a diagram showing simulation waveforms of an input signal, an output signal, a first common-mode level, a second common-mode level, a first dynamic current and a second dynamic current of an operation amplifier according to an embodiment of the present invention.

FIG. 2 is a diagram showing simulation waveforms of an input signal $V_{in}$, an output signal $V_{out}$, a first common-mode level $V_{NCOM}$, a second common-mode level $V_{PCOM}$, a first dynamic current IMN and a second dynamic current IMP of the operation amplifier 100 according to an embodiment of the present invention, wherein the ordinate axis represents voltage (V) and current (I), and the abscissa axis represents time (T), $V_{out\_od}$ represents the output signal from the output terminal OUT of the op-amp 100 without the circuit for providing dynamic current 107, and $V_{out\_nw}$ represents the output signal from the output terminal OUT of the op-amp 100 with the circuit for providing dynamic current. 107.

Referring to FIGS. 1 and 2, when the input signals $V_{in}$ respectively received by the first input terminal IN1 and the second input terminal IN2 of the op-amp 100 get a first transition (i.e. a transition from the low level to the high level), the first transistor Tr1 is turned on and the second transistor Tr2 is turned off because the level of the output signal $V_{out}$ at the time is lower than the first common-mode level $V_{NCOM}$ and the second common-mode level $V_{PCOM}$. Thus, the bias current at the first input terminal IN1 of the op-amp 100 is increased by the first dynamic current IMN.

In addition, when the input signals $V_{in}$ respectively received by the first input terminal IN1 and the second input terminal IN2 of the op-amp 100 get a second transition (i.e. a transition from the high level to the low level), the first transistor Tr1 is turned off and the second transistor Tr2 is turned on because the level of the output signal $V_{out}$ at the time is higher than the first common-mode level $V_{NCOM}$ and the second common-mode level $V_{PCOM}$. Thus, the bias current at the second input terminal IN2 of the op-amp 100 is increased by the second dynamic current IMP. In the present embodiment, the first dynamic current IMN and the second dynamic current IMP are respectively provided by the first current source $I_1$ and the second current source $I_2$, and the first current source $I_1$ and the second current source $I_2$ have constant current source characteristic or variable current source characteristic.

Note that when the input signals $V_{in}$ respectively received by the first input terminal IN1 and the second input terminal IN2 of the op-amp 100 get a first transition and a second transition, the op-amp 100 is in transient state; otherwise, the op-amp is in steady state.

It can be seen from the above described, when the first transistor Tr1 or the second transistor Tr2 is turned on when the op-amp 100 is in transient state, accordingly, the bias current at the first input terminal IN1 or the second input terminal IN2 would be respectively increased by the first dynamic current IMN or the second dynamic current IMP, so that the internal slew rate of the op-amp 100 is advanced and the transient response thereof is accelerated to be competent for processing high frequency signals.

Moreover when the op-amp 100 is in steady state, the first transistor Tr1 and the second transistor Tr2 are turned off. At the point, the first input terminal IN1 and the second input terminal IN2 of the op-amp 100 would not respectively receive the first dynamic current IMN and the second dynamic current IMP, the bias currents thereof would not be increased. Therefore, the pole/zero point and the GBP position of the op-amp 100 are not drifted, which benefits to increase the stability of the op-amp 100 a lot, and the power consumption of the op-amp 100 would not increased too as the op-amp 100 is in steady state.

Figure 3:
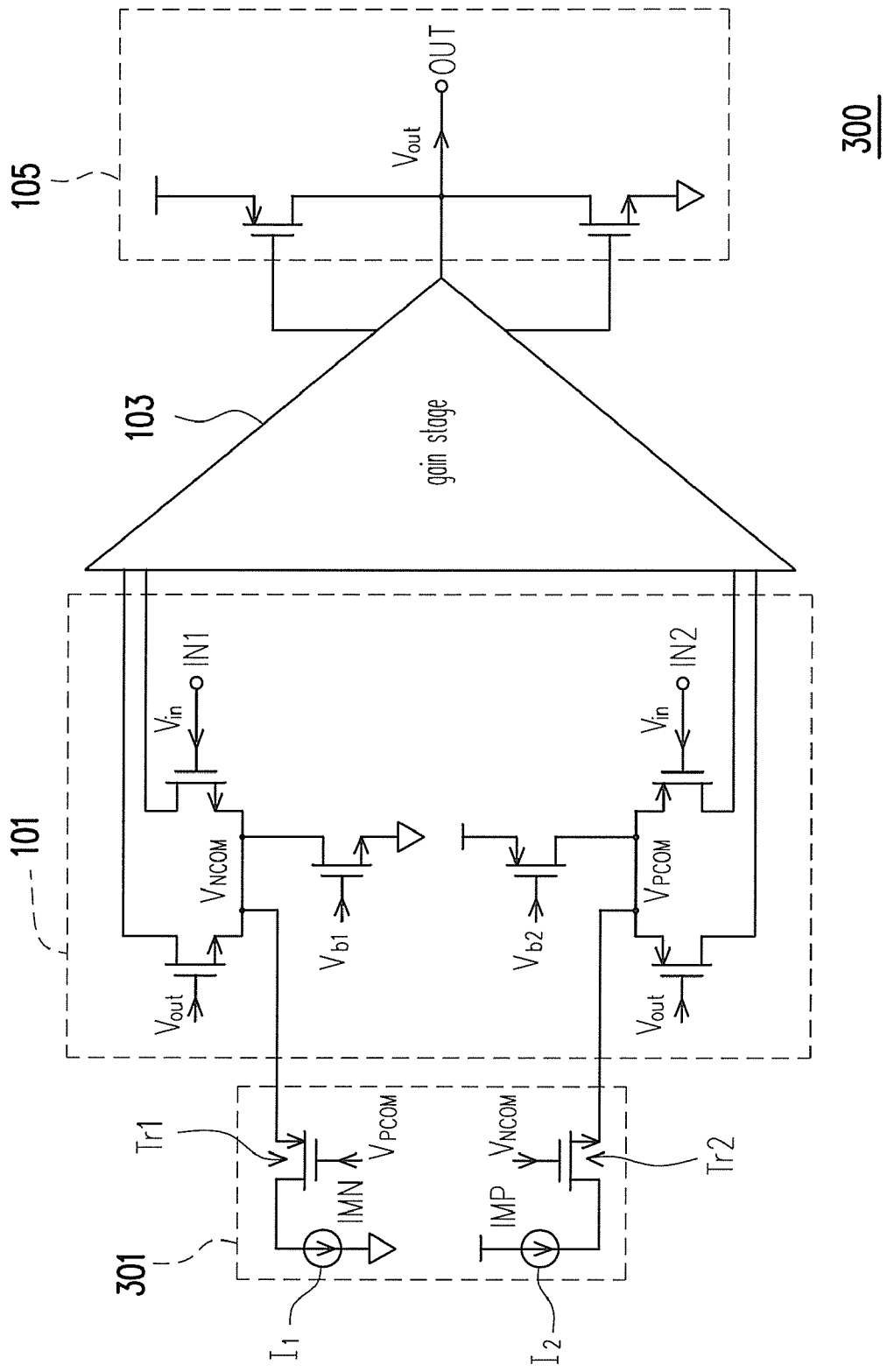
FIG. 3 is a circuit diagram of an operation amplifier according to another embodiment of the present invention.

FIG. 3 is a circuit diagram of an operation amplifier 300 according to another embodiment of the present invention. Referring to FIG. 3, the most different feature of the op-amp 300 from the op-amp 100 rests in the circuit for providing dynamic current 301 is different from the circuit for providing dynamic current 107. In the present embodiment, the circuit for providing dynamic current 301 includes a first transistor Tr1 and a second transistor Tr2, wherein the gate of the first transistor Tr1 is used for receiving the second common-mode level $V_{PCOM}$, the source of the first transistor Tr1 is used for receiving the first common-mode level $V_{NCOM}$, and the drain of the first transistor Tr1 is used for receiving a first dynamic current IMN. The gate of the second transistor Tr2 is used for receiving the first common-mode level $V_{NCOM}$, the source of the second transistor Tr2 is used for receiving the second common-mode level $V_{PCOM}$, and the drain of the second transistor Tr2 is used for receiving a second dynamic current IMP. In the present embodiment, the first transistor Tr1 is implemented by a PMOS-type transistor, and the second transistor Tr2 is implemented by an NMOS-type transistor.

Figure 4:
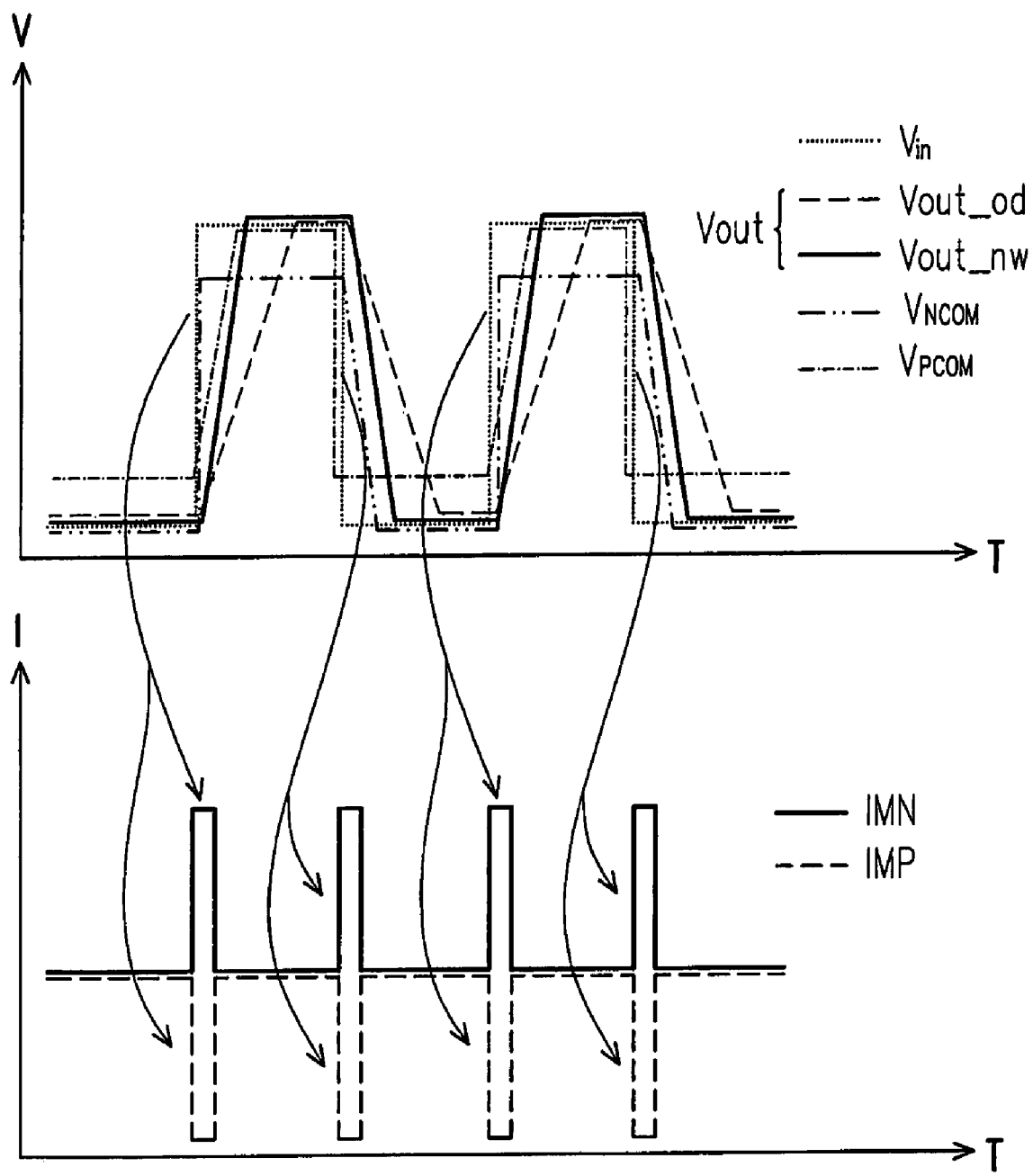
FIG. 4 is a diagram showing simulation waveforms of an input signal, an output signal, a first common-mode level, a second common-mode level, a first dynamic current and a second dynamic current of an operation amplifier according to another embodiment of the present invention.

FIG. 4 is a diagram showing simulation waveforms of an input signal $V_{in}$, an output signal $V_{out}$, a first common-mode level $V_{NCOM}$, a second common-mode level $V_{PCOM}$, a first dynamic current IMN and a second dynamic current IMP of an operation amplifier 300 according to another embodiment of the present invention wherein the ordinate axis represents voltage (V) and current (I), and the abscissa axis represents time (T), $V_{out\_od}$ represents the output signal from the output terminal OUT of the op-amp 300 without the circuit for providing dynamic current 301 and $V_{out\_nw}$ represents the output signal from the output terminal OUT of the op-amp 300 with the circuit for providing dynamic current 301.

Referring to FIGS. 3 and 4, when the input signals $V_{in}$ respectively received by the first input terminal IN1 and the second input terminal IN2 of the op-amp 300 get a first transition (i.e. a transition from the low level to the high level) and a second transition (i.e. a transition from the high level to the low level), the first transistor Tr1 and the second transistor Tr2 are turned on because the second common-mode level $V_{PCOM}$ at the time is lower than the first common-mode level $V_{NCOM}$. Thus, the bias currents at the first input terminal IN1 and the second input terminal IN2 of the op-amp 300 are respectively increased by the first dynamic current IMN and the second dynamic current IMP. In the present embodiment, the first dynamic current IMN and the second dynamic current IMP are respectively provided by the first current source $I_1$ and the second current source $I_2$, and the first current source $I_1$ and the second current source $I_2$ have constant current source characteristic or variable current source characteristic.

It can be seen from the above described, when the first transistor Tr1 and the second transistor Tr2 are turned on when the op-amp 300 is in transient state, accordingly, the bias currents at the first input terminal IN1 and the second input terminal IN2 would be respectively increased by the first dynamic current IMN and the second dynamic current IMP, so that the internal slew rate of the op-amp 300 is advanced. Note that no matter the input signals $V_{in}$ get a first transition or a second transition, the first transistor Tr1 and the second transistor Tr2 of the circuit for providing dynamic current 301 are turned on in the embodiment, thus, in comparison with the circuit for providing dynamic current 107, the circuit for providing dynamic current 301 makes the internal slew rate of the op-amp 300 faster than the internal slew rate of the op-amp 100, which makes the op-amp 300 competent for processing frequency signals higher than the frequency the op-amp 300 can deal with.

Moreover, when the op-amp 300 is in steady state, the first transistor Tr1 and the second transistor Tr2 are turned off. At the point, the first input terminal IN1 and the second input terminal IN2 of the op-amp 300 would not respectively receive the first dynamic current IMN and the second dynamic current IMP, the bias currents thereof would not be increased. Therefore, the pole/zero point and the GBP position of the op-amp 300 are not drifted, which benefits to increase the stability of the op-amp 300 a lot, and the power consumption of the op-amp 300 would not increased too as the op-amp 300 is in steady-state.

In summary, the present invention provides a circuit for providing dynamic current suitable for an op-amp today. The circuit employs two transistors to be simultaneously or non-simultaneously turned on when the input signals respectively received by the first input terminal and the second input terminal of the op-amp get a transition (i.e. the op-amp is in transient state), so as to increase the bias currents of the first input terminal or/and the second input terminal of the op-amp by a dynamic current. Therefore, the circuit for providing dynamic current of the present invention not only advances the internal slew rate of the op-amp, but also accelerates the transient response of the op-amp to suit processing a higher frequency signal. In addition, the power consumption of the op-amp is not increased as the op-amp is in steady state and the stability thereof is advanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit for providing dynamic current, suitable for an operation amplifier, the circuit comprising:
   a first transistor, having a gate, a drain and a source, wherein the gate of the first transistor receives an output signal outputted by an output terminal of the operation amplifier, the source of the first transistor receives a first common-mode level, and the drain of the first transistor receives a first dynamic current; and
   a second transistor, having a gate, a drain and a source, wherein the gate of the second transistor receives the output signal, the source of the second transistor receives a second common-mode level, and the drain of the second transistor receives a second dynamic current, wherein two input signals are respectively received by a first input terminal and a second input terminal of the operation amplifier, and the input signals and the output signal have the first common-mode level and the second common-mode level respectively,
   wherein when the input signals respectively received by the first input terminal and the second input terminal get a first transition, the first transistor is turned on and the second transistor is turned off, so that a bias current of the first input terminal of the operation amplifier is increased by the first dynamic current;
   when the input signals respectively received by the first input terminal and the second input terminal get a second transition, the first transistor is turned off and the second transistor is turned on, so that the bias current of the second input terminal of the operation amplifier is increased by the second dynamic current; and
   when the input signals respectively received by the first input terminal and the second input terminal are in a steady state, the first transistor and the second transistor are simultaneously turned off, so that the bias currents of the first input terminal and the second input terminal of the operation amplifier are not increased by both of the first dynamic current and the second dynamic current.

2. The circuit according to claim 1, wherein the first transition comprises a transition from a low level to a high level and the second transition comprises the transition from the high level to the low level.

3. The circuit according to claim 1, wherein the first dynamic current and the second dynamic current are respectively provided by a first current source and a second current source, and the first current source and the second current source have a constant current source characteristic or a variable current source characteristic.

4. The circuit according to claim 1, wherein the first transistor is a PMOS-type transistor and the second transistor is an NMOS-type transistor.

5. An operation amplifier, comprising:
   a circuit for providing dynamic current, comprising:
      a first transistor, having a gate, a drain and a source, wherein the gate of the first transistor receives an output signal outputted by an output terminal of the operation amplifier, the source of the transistor receives a first common-mode level, and the drain of the first transistor receives a first dynamic current; and
      a second transistor, having a gate, a drain and a source, wherein the gate of the second receives the output signal, the source of the second transistor receives a second common-mode level, and the drain of the second transistor receives a second dynamic current, wherein two input signals are respectively received by a first input terminal and a second input terminal of the operation amplifier, and the input signals and the output signal have the first common-mode level and the second common-mode level respectively,
   wherein when the input signals respectively received by the first input terminal and the second input terminal get a first transition, the first transistor is turned on and the second transistor is turned off, so that a bias current of the first input terminal of the operation amplifier is increased by the first dynamic current;
   when the input signals respectively received by the first input terminal and the second input terminal get a second transition, the first transistor is turned off and the second transistor is turned on, so that the bias current of the second input terminal of the operation amplifier is increased by the second dynamic current; and
   when the input signals respectively received by the first input terminal and the second input terminal are in a steady state, the first transistor and the second transistor are simultaneously turned off, so that the bias currents of the first input terminal and the second input terminal of the operation amplifier are not increased by both of the first dynamic current and the second dynamic current.

6. The operation amplifier according to claim 5, wherein the first transition comprises a transition from a low level to a high level and the second transition comprises the transition from the high level to the low level.

7. The operation amplifier according to claim 5, wherein the first dynamic current and the second dynamic current are respectively provided by a first current source and a second current source, and the first current source and the second current source have a constant current source characteristic or a variable current source characteristic.

8. The operation amplifier according to claim 5, wherein the first transistor is a PMOS-type transistor and the second transistor is an NMOS-type transistor.

* * * * *